(12) United States Patent
Ikeda

(10) Patent No.: US 9,701,051 B2
(45) Date of Patent: Jul. 11, 2017

(54) PHYSICAL QUANTITY MEASUREMENT SENSOR, METHOD OF MANUFACTURING PHYSICAL QUANTITY MEASUREMENT SENSOR, SEALING STRUCTURE OF PHYSICAL QUANTITY MEASUREMENT SENSOR AND METHOD OF MANUFACTURING CABLE WITH RESIN MOLDED BODY

(71) Applicant: Hitachi Metals, Ltd., Tokyo (JP)

(72) Inventor: Yukio Ikeda, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 127 days.

(21) Appl. No.: 14/519,687

(22) Filed: Oct. 21, 2014

(65) Prior Publication Data

US 2015/0158220 A1   Jun. 11, 2015

(30) Foreign Application Priority Data

Dec. 10, 2013   (JP) .................................. 2013-254677
Jul. 9, 2014   (JP) .................................. 2014-141214

(51) Int. Cl.
*B29C 45/14*   (2006.01)
*G01R 1/067*   (2006.01)
(Continued)

(52) U.S. Cl.
CPC .... *B29C 45/14311* (2013.01); *B29C 45/0046* (2013.01); *B29C 45/14426* (2013.01);
(Continued)

(58) Field of Classification Search
None
See application file for complete search history.

(56) References Cited

U.S. PATENT DOCUMENTS 5,013,495 A * 5/1991 Noba ..................... B29C 33/123
                                                              264/1.25
7,722,395 B2   5/2010 Iwase et al.
(Continued)

FOREIGN PATENT DOCUMENTS

EP   1837886   9/2007
FR   83538     8/1964
(Continued)

OTHER PUBLICATIONS

European Search Report 14189953.4-1558 dated Apr. 14, 2015.

*Primary Examiner* — Jermele M Hollington
*Assistant Examiner* — Douglas X Rodriguez
(74) *Attorney, Agent, or Firm* — Robert Mlotkowski Safran Cole & Calderon P.C.

(57) ABSTRACT

A method of manufacturing a physical quantity measurement sensor, which includes a measurement portion, a cable including a conductor electrically connected to the measurement portion and a sheath, and a resin molded body covering at least an end portion of the cable. The method includes arranging the measurement portion connected to the cable in a mold, and molding the resin molded body by injecting a molten resin toward the sheath through an injection hole formed in the mold. The injection hole is formed at a position distant from the cable and includes a central axis inclined with respect to the axial direction of the cable at an opening facing an inside of the mold. The molding is conducted such that the sheath arranged in the mold is at least partially melted by heat of the molten resin injected through the injection hole and is adhered to the resin molded body.

10 Claims, 9 Drawing Sheets

(51) Int. Cl.
*G01D 11/24* (2006.01)
*B29C 45/00* (2006.01)
B29K 105/00 (2006.01)
B29L 31/00 (2006.01)

(52) U.S. Cl.
CPC ........... *G01D 11/245* (2013.01); *G01R 1/067* (2013.01); *B29C 45/14639* (2013.01); *B29C 2045/0027* (2013.01); *B29C 2045/14319* (2013.01); *B29K 2105/258* (2013.01); *B29L 2031/752* (2013.01)

(56) References Cited

U.S. PATENT DOCUMENTS

2008/0132104 A1* 6/2008 Iwase ............... B29C 45/14311 439/279
2008/0204007 A1 8/2008 Kim
2016/0089823 A1* 3/2016 Ikeda ................. B29C 45/0053 29/428

FOREIGN PATENT DOCUMENTS

GB 856040 12/1960
JP 08-111260 4/1996

* cited by examiner

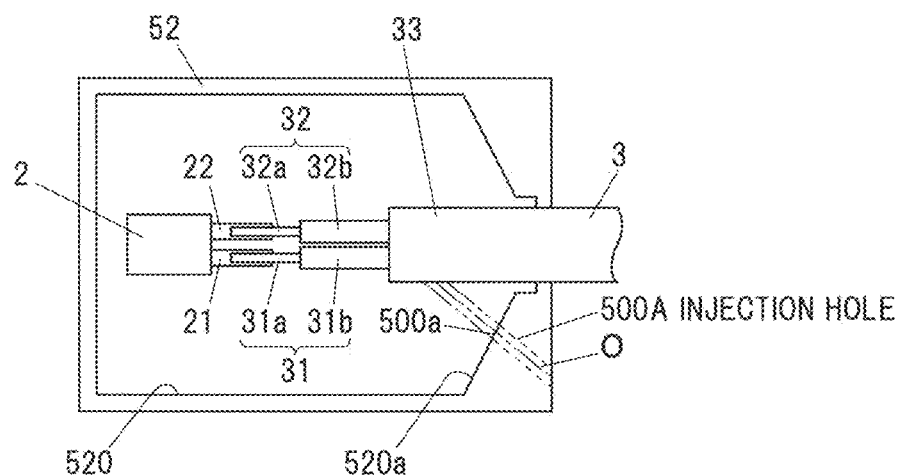
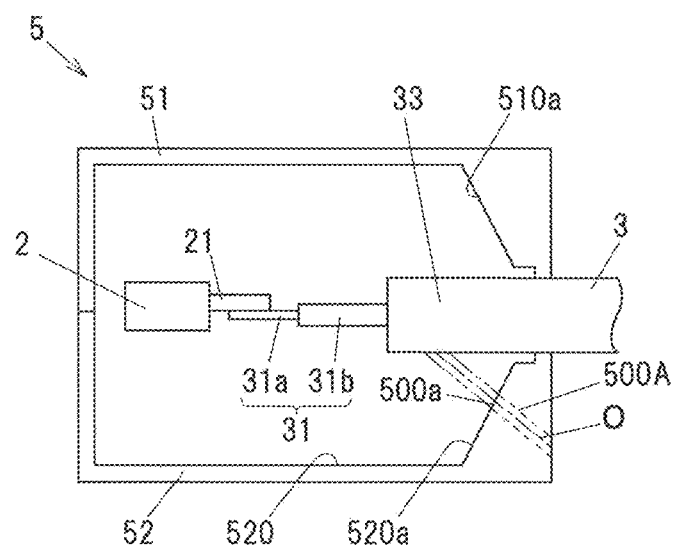

PHYSICAL QUANTITY MEASUREMENT SENSOR, METHOD OF MANUFACTURING PHYSICAL QUANTITY MEASUREMENT SENSOR, SEALING STRUCTURE OF PHYSICAL QUANTITY MEASUREMENT SENSOR AND METHOD OF MANUFACTURING CABLE WITH RESIN MOLDED BODY

The present application is based on Japanese patent application Nos. 2013-254677, 2014-141214 filed on Dec. 10, 2013 and Jul. 9, 2014, respectively, the entire contents of which are incorporated herein by reference.

BACKGROUND OF THE INVENTION

1. Field of the Invention

The invention relates to a method of manufacturing a physical quantity measurement sensor, the physical quantity measurement sensor, a sealing structure of the physical quantity measurement sensor and a method of manufacturing a cable with a resin molded body.

2. Description of the Related Art

A sealing structure of a physical quantity measurement sensor is known that is provided with a sensor in a molded resin and a cable connected to the sensor (see e.g. JP-A-H08-111260).

A rotation sensor disclosed in JP-A-H08-111260 is provided with a cable (wire harness) connected to an output terminal of a detection portion, a sealing member (sealing portion) provided on an outer periphery of the cable and a molded resin covering a portion of the cable and the sealing member. The sealing member is formed of a thermoplastic resin adhesive to a sheath (outer skin) of the cable, and has plural crest portions with sharp top and plural trough portions on the outer periphery. The top portions of the plural crest portions of the sealing member are melted by heat of the molten resin to be molded into a molded resin, causing the sealing member to be adhered to the molded resin and to be attached to the sheath of the cable. This provides watertightness (sealing properties) between the sealing member and the molded resin and between the sealing member and the cable.

SUMMARY OF THE INVENTION

The rotation sensor disclosed in JP-A-H08-111260 may cause a problem that the sealing member formed separately from the molded resin increases the number of components, leading to an increase in the manufacturing process and the cost. In addition, since only the inner surface of the sealing member is attached to the sheath of the cable, it is difficult to prevent the intrusion of water from a gap between the sealing member and the cable depending on the use environment.

It is an object of the invention to provide a method of manufacturing a physical quantity measurement sensor that ensures the sealing properties between the sensor and the cable while simplifying the manufacturing process and reducing the cost, as well as the physical quantity measurement sensor, a sealing structure of the physical quantity measurement sensor and a method of manufacturing cable with a resin molded body.

(1) According to one embodiment of the invention, a method of manufacturing a physical quantity measurement sensor, wherein the physical quantity measurement sensor comprises a measurement portion for measuring a physical quantity, a cable comprising a conductor electrically connected to the measurement portion and a sheath covering the conductor, and a resin molded body covering at least an end portion of the cable on a side of the measurement portion, comprises:

arranging the measurement portion connected to the cable in a mold; and molding the resin molded body by injecting a molten resin toward the sheath through an injection hole formed in the mold, wherein the injection hole is formed at a position distant from the cable and comprises a central axis inclined with respect to the axial direction of the cable at an opening facing an inside of the mold, and wherein the molding is conducted such that the sheath arranged in the mold is at least partially melted by heat of the molten resin injected through the injection hole and is adhered to the resin molded body.

(2) According to another embodiment of the invention, a physical quantity measurement sensor comprises:

a measurement portion for measuring a physical quantity;

a cable comprising a conductor electrically connected to the measurement portion and a sheath covering the conductor; and a resin molded body covering at least an end portion of the cable on a side of the measurement portion, wherein the sheath of the cable covered with the resin molded body is at least partially melted and is adhered to the resin molded body.

(3) According to another embodiment of the invention, a sealing structure of a physical quantity measurement sensor, wherein the physical quantity measurement sensor comprises a measurement portion for measuring a physical quantity, a cable electrically connected to the measurement portion and a resin molded body covering at least an end portion of the cable on a side of the measurement portion, and wherein a sheath of the cable covered with the resin molded body is at least partially melted and is adhered to the resin molded body, thereby sealing between the resin molded body and the cable.

(4) According to another embodiment of the invention, a method of manufacturing a cable with a resin molded body, wherein the cable comprises a conductor and a sheath covering the conductor and the resin molded body covering at least an end portion of the cable, comprises:

arranging the end portion of the cable in a mold; and molding the resin molded body by injecting a molten resin toward the sheath through an injection hole formed in the mold, wherein the injection hole is formed at a position distant from the cable and comprises a central axis inclined with respect to an axial direction of the cable at an opening facing an inside of the mold, and wherein the molding is conducted such that the sheath arranged in the mold is at least partially melted by heat of the molten resin injected through the injection hole and is adhered to the resin molded body.

Effects of the Invention

According to one embodiment of the invention, a method of manufacturing a physical quantity measurement sensor can be provided that ensures the sealing properties between the sensor and the cable while simplifying the manufacturing process and reducing the cost, as well as the physical quantity measurement sensor, a sealing structure of the physical quantity measurement sensor and a method of manufacturing cable with a resin molded body.

BRIEF DESCRIPTION OF THE DRAWINGS

Next, the present invention will be explained in more detail in conjunction with appended drawings, wherein:

FIGS. 1A to 1C show a physical quantity measurement sensor in a first embodiment of the present invention, wherein FIG. 1A is a top view, FIG. 1B is a side view and FIG. 1C is a diagram as viewed from a direction of arrow A in FIG. 1A;

FIGS. 2A to 2F are schematic views showing the manufacturing process of the physical quantity measurement sensor as viewed from an upper mold side, wherein FIG. 2A shows a state in which a measurement portion connected to a cable is arranged in a mold and FIGS. 2B to 2F show movement of a molten resin flowing in the mold;

FIGS. 3A to 3F are schematic views showing the manufacturing process of the physical quantity measurement sensor as viewed from a side, wherein FIG. 3A shows a state in which the measurement portion connected to the cable is arranged in the mold and FIGS. 3B to 3F show movement of the molten resin flowing in the mold;

FIGS. 4A and 4B are explanatory diagrams illustrating the manufacturing process of the physical quantity measurement sensor 1 in a modification of the first embodiment of the invention and showing a state in which the cable 3 and the measurement portion 2 are arranged in a lower mold 52;

FIGS. 6A to 6F are schematic views showing the manufacturing process of the physical quantity measurement sensor in the second embodiment as viewed from a side of a mold, wherein FIG. 6A shows a state in which the measurement portion connected to the cable is arranged in the mold and FIGS. 6B to 6F show movement of the molten resin flowing in the mold;

FIGS. 8A to 8F are schematic views showing the manufacturing process of the physical quantity measurement sensor in the modification of the second embodiment as viewed from an upper mold side, wherein FIG. 8A shows a state in which the measurement portion connected to the cable is arranged in the mold and FIGS. 8B to 8F show movement of the molten resin flowing in the mold;

DETAILED DESCRIPTION OF THE PREFERRED EMBODIMENTS

First Embodiment

A physical quantity measurement sensor in the first embodiment of the invention is used as, e.g., an in-vehicle sensor which is mounted on a vehicle to measure revolution of wheels or rotation angle of steering wheel, etc.

Configuration of Physical Quantity Measurement Sensor 1

Firstly, the configuration of the physical quantity measurement sensor 1 will be described below in reference to FIGS. 1A to 1C.

Figure 1A:
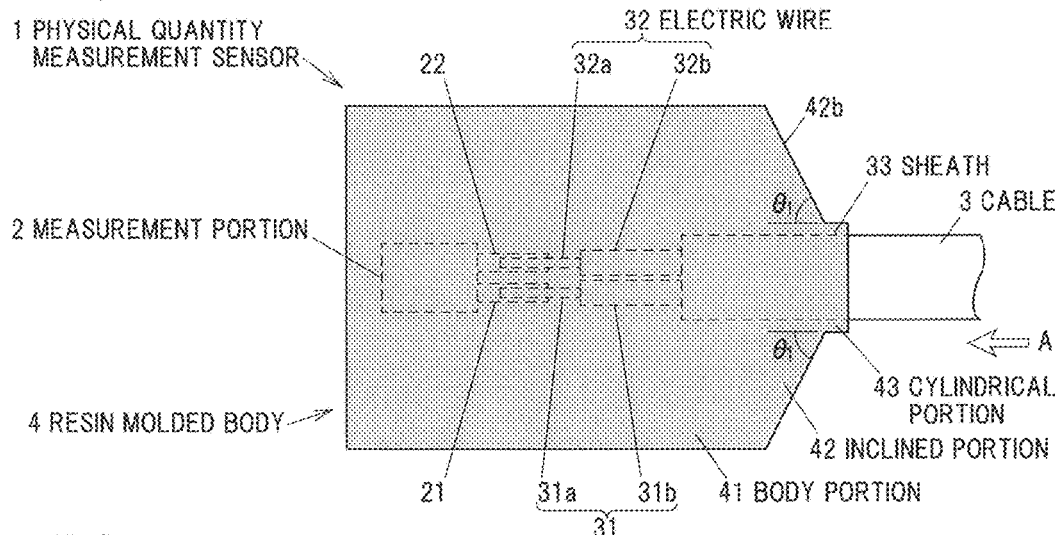
Figure 1B:
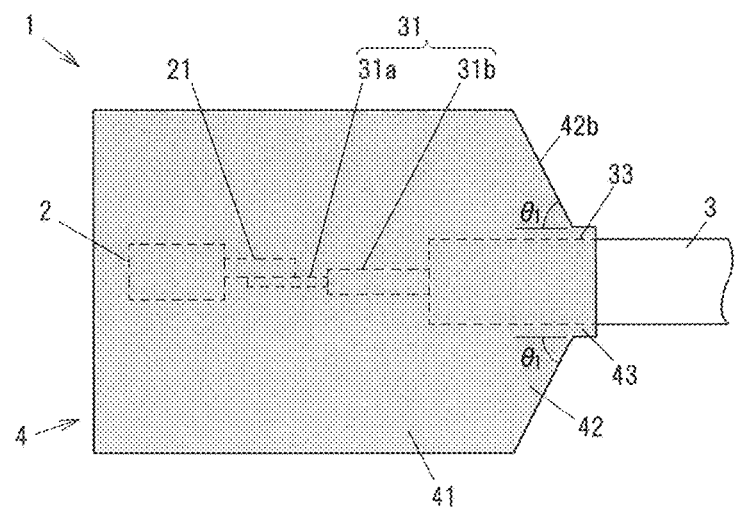
Figure 1C:
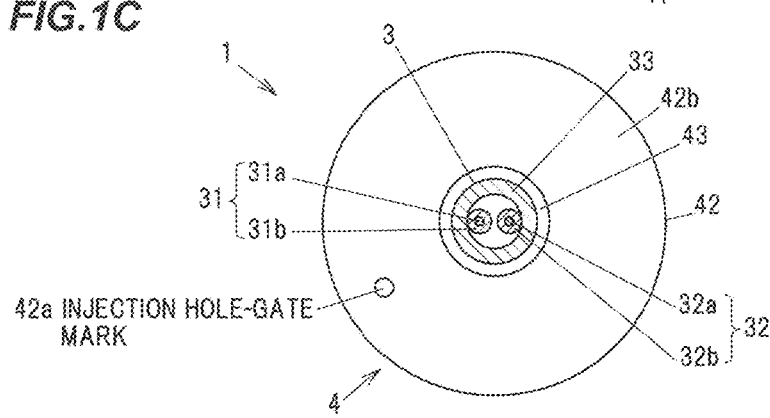

FIGS. 1A to 1C show the physical quantity measurement sensor 1 in the first embodiment of the invention, wherein FIG. 1A is a top view, FIG. 1B is a side view and FIG. 1C is a diagram as viewed from a direction of arrow A in FIG. 1A. Note that, a portion covered with a resin molded body 4 is indicated by a dashed line in FIGS. 1A and 1B.

The physical quantity measurement sensor 1 is provided with a measurement portion 2 for measuring a physical quantity, a cable 3 composed of center conductors 31a and 32a electrically connected to the measurement portion 2 and a sheath 33 covering the center conductors 31a and 32a, and a resin molded body 4 covering at least an end portion of the cable 3 on the measurement portion 2 side. The physical quantity measurement sensor 1 is one aspect of the cable with resin molded body of the invention.

The measurement portion 2 has, e.g., a hall IC thereinside to detect a magnetic field and is provided with plural (two in the first embodiment) terminals 21 and 22 at an end portion. Note that, the measurement portion 2 is not limited to those which measure a magnetic field as long as it is capable of measuring a physical quantity in a state of being covered with the resin molded body 4, and the measurement portion 2 may be used for measuring, e.g., temperature or vibration.

In the first embodiment, the cable 3 is formed by providing the sheath 33 to cover electric wires 31 and 32 respectively having the center conductors 31a and 32a and insulations 31b and 32b covering the center conductors 31a and 32a. The center conductors 31a and 32a are exposed from the insulations 31b and 32b at tip portions of the electric wires 31 and 32 on the measurement portion 2 side. The exposed center conductors 31a and 32a are connected to the terminals 21 and 22 of the measurement portion 2 by, e.g., soldering, etc.

At a portion of the cable 3 covered with the resin molded body 4, the sheath 33 is at least partially melted and is adhered to the resin molded body 4. In more detail, at a portion of the cable 3 covered with the resin molded body 4, the sheath 33 is melted over the entire circumference and is adhered to the resin molded body 4. This seals between the cable 3 and the resin molded body 4.

In the first embodiment, the sheath 33 is formed of a resin material, e.g., urethane, etc., and the resin molded body 4 is formed of a resin material, e.g., nylon, etc. However, the resin materials used for the cable 3 and the resin molded body 4 are not limited thereto and can be appropriately selected according to the intended use. It is also possible to use the same resin material (e.g., polybutylene terephthalate (PBT), etc.).

The resin molded body 4 integrally has a columnar body portion 41, an inclined portion 42 having an inclined surface 42b directed to the cable 3 and inclined with respect to the axial direction of the cable 3, and a cylindrical portion 43 protruding from an end portion of the inclined portion 42 in a lead-out direction of the cable 3.

The body portion 41 is formed so that a radial dimension thereof is larger than that of the cylindrical portion 43. The inclined portion 42 is formed to radially expand from the outer peripheral surface of the cylindrical portion 43 toward the outer peripheral surface of the body portion 41. Therefore, the radial thickness of the inclined portion 42 is smaller at an end portion on the cylindrical portion 43 side than at an end portion on the body portion 41 side.

In the first embodiment, an angle $\theta_1$ formed between the inclined surface 42b of the inclined portion 42 and the central axis of the cable 3 is set to 30° to 75°. As shown in FIG. 1C, an injection hole-gate mark 42a which is left in the below-described manufacturing process of the physical quantity measurement sensor 1 is formed on the inclined surface 42b. In the first embodiment, the injection hole-gate mark 42a has a circular shape.

Method of Manufacturing Physical Quantity Measurement Sensor 1

Next, a method of manufacturing the physical quantity measurement sensor 1 will be described below in reference to FIGS. 2A to 2F and 3A to 3F.

Figure 2A:
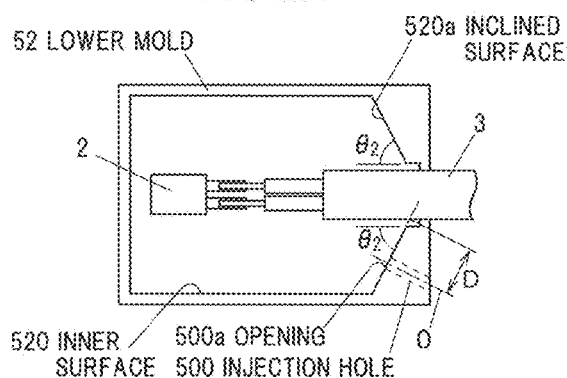
Figure 2D:
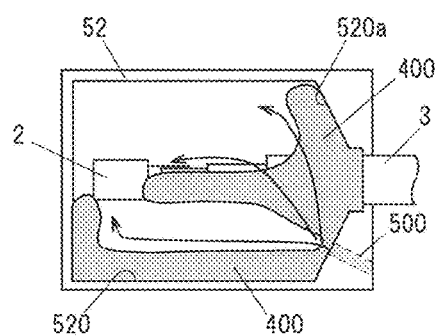

FIGS. 2A to 2F are explanatory diagrams illustrating the manufacturing process of the physical quantity measurement sensor 1, wherein FIG. 2A shows a state in which the measurement portion 2 connected to the cable 3 is arranged in the lower mold 52 and FIGS. 2B to 2F show the flow of a molten resin 400 in the lower mold 52. FIGS. 3A to 3F are explanatory diagrams illustrating the manufacturing process of the physical quantity measurement sensor 1 as viewed from a side, wherein FIG. 3A shows a state in which the measurement portion 2 connected to the cable 3 is arranged in a mold 5 and FIGS. 3B to 3F show the flow of the molten resin 400 in the mold 5. Note that, arrows in FIGS. 2A to 3F indicate directions of flow of the molten resin 400.

The manufacturing process of the physical quantity measurement sensor 1 includes an arrangement step of arranging the measurement portion 2 connected to the cable 3 in the mold 5 and a molding step of molding the resin molded body 4 by injecting the molten resin 400 toward the sheath 33 through an injection hole 500 formed in the mold 5.

As shown in FIG. 3A, the mold 5 is formed by combining an upper mold 51 and the lower mold 52, and the injection hole 500 used for injecting the molten resin 400 is formed in the lower mold 52. Note that, the injection hole 500 is indicated by a dashed line in FIGS. 2A to 3F. Here, the injection hole 500 does not necessarily need to be formed in the lower mold 52 and may be formed in the upper mold 51 or may be formed when the upper mold 51 is combined with the lower mold 52.

The upper mold 51 and the lower mold 52 respectively have inner surfaces 510 and 520 respectively including inclined surfaces 510a and 520a which are directed to the cable 3 arranged in the mold 5 and are inclined with respect to the axial direction of the cable 3. In the first embodiment, an angle $\theta_2$ formed between the inclined surface 510a, 520a and the axial direction of the cable 3 is set to 30° to 75°, as shown in FIGS. 2A and 3A. Thus, the angle $\theta_1$ formed between the inclined surface 42b of the inclined portion 42 of the resin molded body 4 and the axial direction of the cable 3 is from 30° to 75° (see FIGS. 1A and 1B).

The injection hole 500 is formed at a position distant from the cable 3 to be arranged in the mold 5 and has a central axis O inclined with respect to the axial direction of the cable 3 at an opening 500a which faces the inside (internal portion) of the mold 5. In the first embodiment, the opening 500a of the injection hole 500 is formed in the inclined surface 520a of the lower mold 52 and the central axis O is thus inclined with respect to the axial direction of the cable 3. The central axis O of the injection hole 500 is indicated by a dash-dot line in FIGS. 2A and 3A. A line extended from the central axis O intersects with the electric wires 31 and 32 exposed from the sheath 33.

If the injection hole 500 is too close to the cable 3, the sheath 33 may be excessively melted and torn due to heat of the molten resin 400 injected through the injection hole 500. The torn sheath 33 may cause the molten resin 400 to enter into the cable 3 and to flow in a direction opposite to the measurement portion 2 side (flow in the lead-out direction of the cable 3), and may cause the cable 3 to lose the original function as a cable.

On the other hand, when the injection hole 500 is too far from the cable 3, the sheath 33 is less likely to melt. Therefore, more specifically, a distance D along the inclined surface 520a from the outer peripheral surface of the sheath 33 to the central axis O of the injection hole 500 at the opening 500a is desirably from 1 to 10 mm.

After the measurement portion 2 connected to the cable 3 is arranged in the mold 5 in the arrangement step, the molten resin 400 is injected into the mold 5 through the injection hole 500 in the molding step. At this time, the temperature of the molten resin 400 is about 300° C. while the temperature of the mold 5 is about 80° C. Therefore, the molten resin 400 flows along the inner surfaces 510 and 520 of the mold 5 which has a lower temperature than the molten resin 400.

Figure 2B:
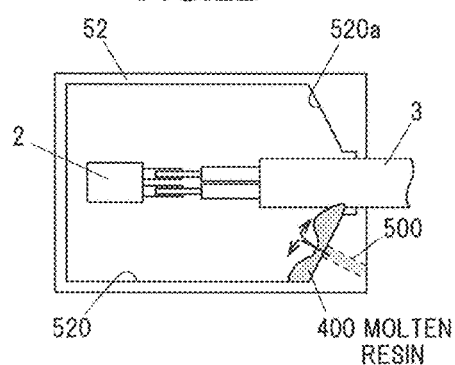
Figure 2E:
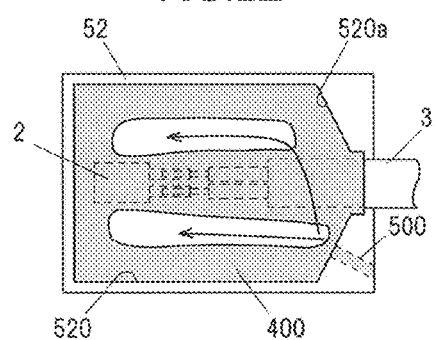
Figure 2C:
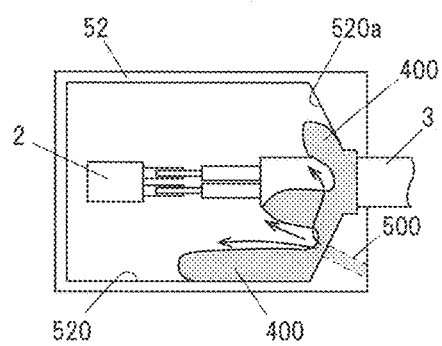
Figure 3A:
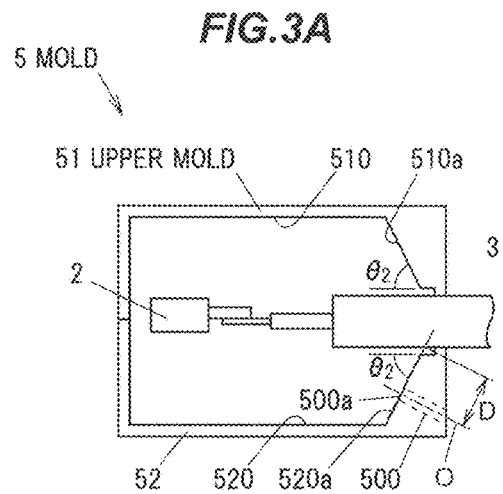
Figure 3D:
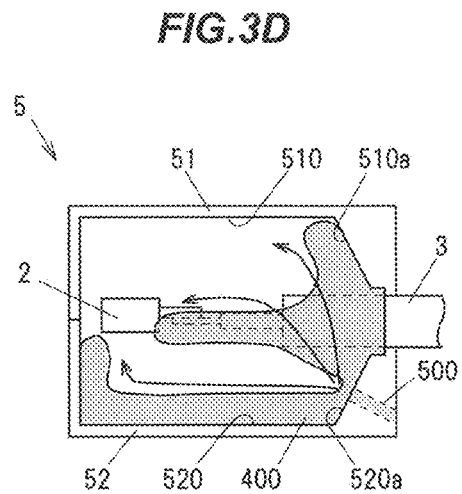
Figure 3B:
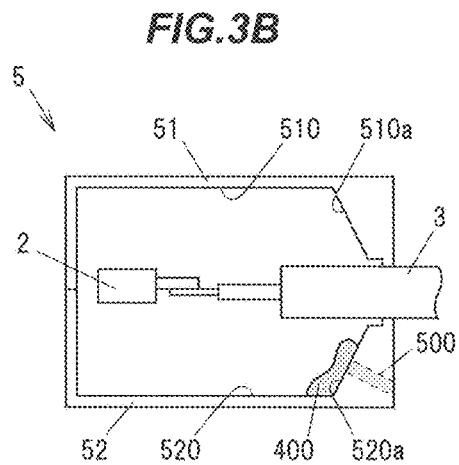
Figure 3E:
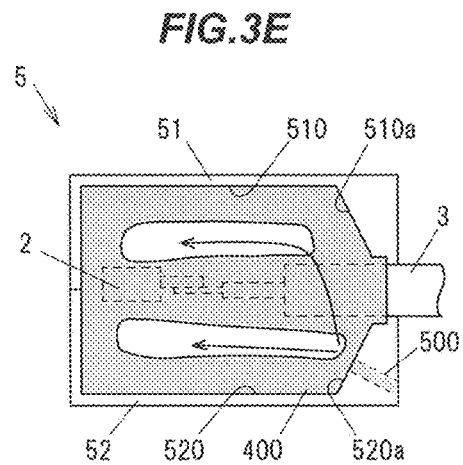
Figure 3C:
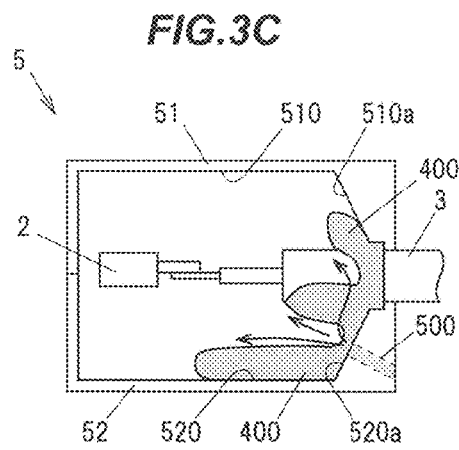

In more detail, the molten resin 400 injected through the injection hole 500 initially spreads circumferentially outward of the opening 500a of the injection hole 500, as shown in FIGS. 2B and 3B. Next, as shown in FIGS. 2C and 3C, a portion of the molten resin 400 flows along the inclined surface 510a of the upper mold 51 and the inclined surface 520a of the lower mold 52, and another portion flows toward the sheath 33 of the cable 3. This occurs because the opening 500a of the injection hole 500 is directed to the cable 3 and the molten resin 400 is injected toward the sheath 33.

The portion of the molten resin 400 then flows along the inner surface 510 of the upper mold 51 and the inner surface 520 of the lower mold 52, as shown in FIGS. 2D and 3D. The other portion of the molten resin 400 flowing toward the sheath 33 now flows toward the measurement portion 2. Once a space in the upper mold 51 on the inner surface 510 side and a space in the lower mold 52 on the inner surface 520 side are filled with the molten resin 400, the molten resin 400 then flows into the remaining inner space of the mold 5.

Figure 2F:
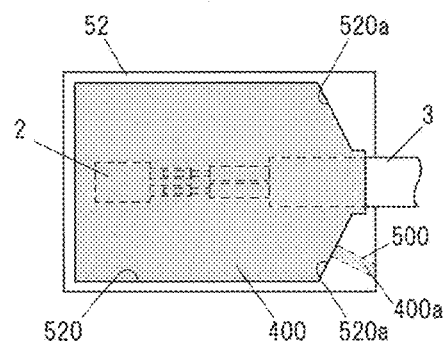
Figure 3F:
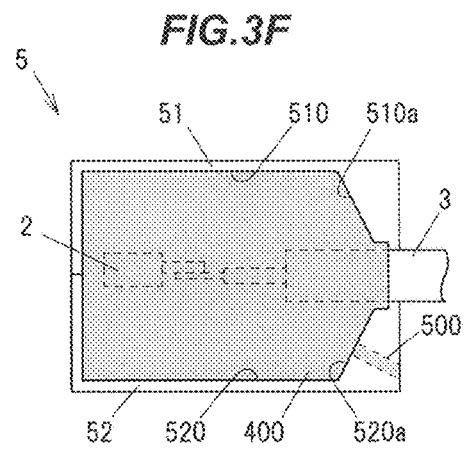

FIGS. 2F and 3F show a state in which the molten resin 400 is filled in the mold 5. The molten resin 400 filled in the mold 5 is solidified by natural cooling, and the sheath 33 and the resin molded body 4 are thus adhered and integrated.

Since the opening 500a of the injection hole 500 is directed to the cable 3 and the molten resin 400 is injected through the injection hole 500 toward the sheath 33 as described above, the very hot molten resin 400 (about 300° C.) always flows around the sheath 33. Thus, the sheath 33 in the first embodiment is melted over the entire circumference by heat of the molten resin 400.

On the resin molded body 4 which has been molded in the mold 5, a portion of the molten resin 400 solidified in the injection hole 500 remains as a protrusion 400a which is removed to finish the product. The injection hole-gate mark 42a shown in FIG. 1C is a gate mark which is left after removing the protrusion 400a.

Functions and Effects of the First Embodiment

The following functions and effects are obtained in the first embodiment.

(1) The injection hole 500 formed in the mold 5 has the central axis O inclined with respect to the axial direction of the cable 3 at the opening 500a facing the inside of the mold 5, and the sheath 33 of the cable 3 is at least partially melted by the heat of the molten resin 400 injected through the injection hole 500 and is directly adhered to the resin molded body 4. This allows sealing properties between the cable 3 and the resin molded body 4 to be provided without separately providing a sealing member. Therefore, it is possible to maintain quality of the physical quantity measurement sensor 1 while reducing the manufacturing process and the cost.

(2) Since the sheath 33 is melted over the entire circumference by the heat of the molten resin 400, the sheath 33 is adhered to the resin molded body 4 more reliably and the sealing properties between the cable 3 and the resin molded body 4 are improved.

(3) Since the mold 5 has the inner surfaces 510 and 520 including the inclined surfaces 510*a* and 520*a* directed to the cable 3 and inclined at 30° to 75° with respect to the axial direction of the cable 3, it is possible to suppress a force of the resin pressing the cable 3 at the time of solidification of the molten resin 400 filled around the cable 3, i.e., the molten resin 400 filled in the portion to be the inclined portion 42 after molding. That is, at the end portion of the resin molded body 4 from which the cable 3 is led out, the pressing force of the resin against the cable 3 at the time of solidification of the molten resin 400 usually increases with an increase in a thickness in a radial direction and a load applied to the cable 3 also increases. However, in the first embodiment, the inclined surfaces 510*a* and 520*a* of the inner surfaces 510 and 520 of the mold 5 which are provided to form the inclined surface 42*b* reduces the radial thickness of the resin molded body 4 at the end portion from which the cable 3 is led out, which allows a force of the resin pressing the cable 3 to be reduced.

(4) The distance D along the inclined surface 520*a* from the sheath 33 of the cable 3 to the central axis O of the injection hole 500 at the opening 500*a* is from 1 to 10 mm. Therefore, even if the sheath 33 is thinned (e.g., about 0.5 to 2.0 mm in thickness) for the purpose of downsizing the physical quantity measurement sensor 1, excessive melting and tearing of the sheath 33 due to the heat of the molten resin 400 can be suppressed.

(5) The resin molded body 4 has the cylindrical portion 43 at the end portion from which the cable 3 is led out. Therefore, even when the cable 3 is bent in a direction intersecting with the axial direction thereof, the cylindrical portion 43 receives a force caused by the bending and it is thus possible to suppress cracks, etc., on the resin molded body 4.

Modification of the First Embodiment

Next, the modification of the first embodiment will be described in reference to FIGS. 4A and 4B. Constituent elements in common with those described in the first embodiment are denoted by the same reference numerals in FIGS. 4A and 4B and the overlapping explanation thereof will be omitted.

In the modification of the first embodiment, an injection hole 500A is formed so that a line extended from the injection hole 500A (indicated by a dash-dot-dot line in FIGS. 4A and 4B) intersects with the sheath 33. In more detail, the injection hole 500A is formed in the mold 5 such that a line extended along the central axis O from an inner surface of the injection hole 500A near the opening 500*a* at least partially intersects with the sheath 33. In other words, if the molten resin 400 injected through the injection hole 500A flows straight ahead along the central axis O, at least a portion of the molten resin 400 hits against the sheath 33.

Thus, even if a portion of the molten resin 400 injected through the injection hole 500A is solidified by contact with the mold 5, at least a portion of the remaining molten resin 400 actively flows directly toward the sheath 33 and this allows the cable 3 to be melt and adhered to the resin molded body 4 more reliably.

Second Embodiment

Next, the second embodiment of the invention will be described in reference to FIGS. 5 to 6F.

Figure 5:
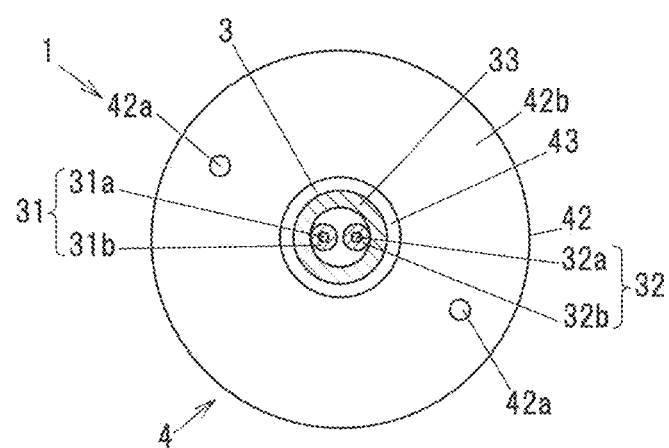
FIG. 5 is a diagram illustrating a physical quantity measurement sensor in a second embodiment of the invention as viewed from a cable lead-out direction.
Figure 6A:
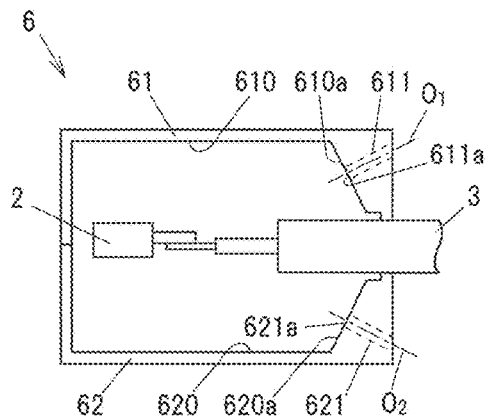

FIG. 5 is a diagram illustrating the physical quantity measurement sensor 1 in the second embodiment of the invention as viewed from the lead-out direction of the cable 3. FIGS. 6A to 6F are schematic views showing the manufacturing process of the physical quantity measurement sensor 1 in the second embodiment as viewed from a side of a mold 6, wherein FIG. 6A shows a state in which the measurement portion 2 connected to the cable 3 is arranged in the mold 6 and FIGS. 6B to 6F show movement of the molten resin 400 flowing in the mold 6.

Figure 6D:
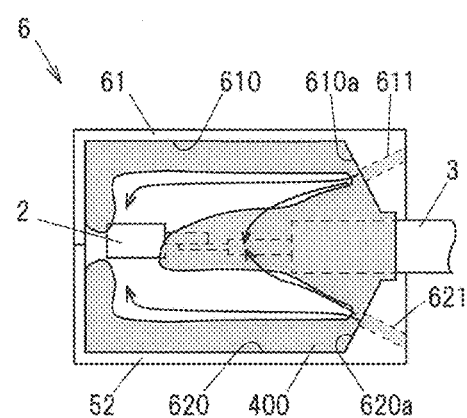
Figure 6B:
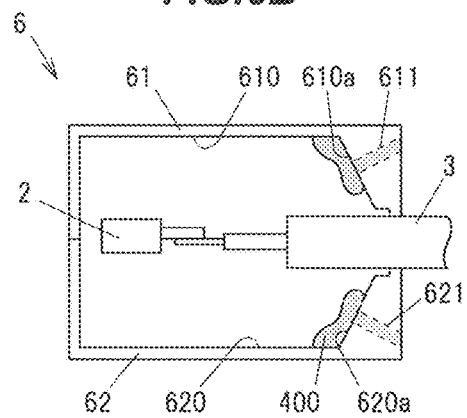
Figure 6E:
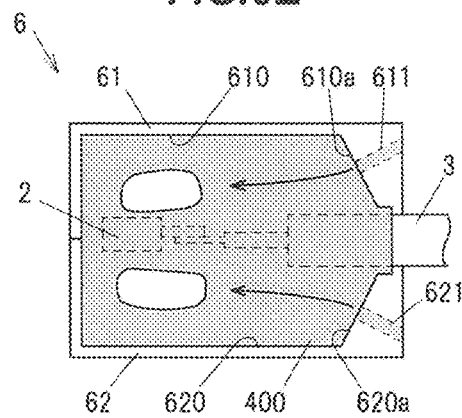
Figure 6C:
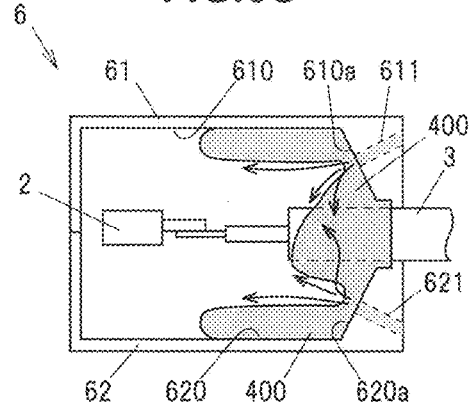
Figure 6F:
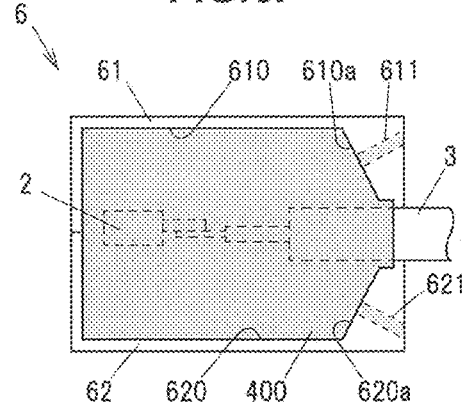

Constituent elements having the same functions as those described in the first embodiment are denoted by the same reference numerals in FIGS. 5 to 6F and the overlapping explanation thereof will be omitted.

The configuration of the physical quantity measurement sensor 1 in the second embodiment is different from that of the physical quantity measurement sensor 1 in the first embodiment in that two injection hole-gate marks 42*a* are formed on the inclined surface 42*b* of the inclined portion 42 of the resin molded body 4 at positions sandwiching the cable 3 in the radial direction thereof. In the second embodiment, the two injection hole-gate marks 42*a* are located symmetrically with respect to the axis of the cable 3.

In other words, the configuration of the mold 6 in the second embodiment is different from the configuration of the mold 5 in the first embodiment. The configuration of the mold 6 will be described in more detail below.

Injection holes 611 and 621 are formed in the mold 6 at positions radially sandwiching the cable 3 which is arranged in the mold 6 in the arrangement step. In the second embodiment, the injection hole 611 is formed in an upper mold 61 and the injection hole 621 is formed in a lower mold 62, as shown in FIGS. 6A to 6F.

The injection hole 611 has an opening 611*a* on an inclined surface 610*a* of the upper mold 61 at a position distant from the cable 3 to be arranged in the mold 6 and has a central axis $O_1$ inclined with respect to the axial direction of the cable 3 at the opening 611*a*. Likewise, the injection hole 621 has an opening 621*a* on an inclined surface 620*a* of the lower mold 62 at a position distant from the cable 3 to be arranged in the mold 6 and has a central axis $O_2$ inclined with respect to the axial direction of the cable 3 at the opening 621*a*.

Thus, the central axis $O_1$ and the central axis $O_2$ are inclined with respect to the axial direction of the cable 3 such that an extension line from the central axis $O_1$ of the injection hole 611 extended on the opening 611*a* side intersects with an extension line from the central axis $O_2$ of the injection hole 621 extended on the opening 621*a* side.

In the molding step, the molten resin 400 injected through the injection holes 611 and 621 initially spreads circumferentially outward of the openings 611*a* and 621*a* in the same manner as the first embodiment, as shown in FIG. 6B.

Then, as shown in FIGS. 6C and 6D, a portion of the molten resin 400 injected through the injection hole 611 flows along the inner surface 610 of the upper mold 61 and another portion flows toward the sheath 33 of the cable 3. A portion of the molten resin 400 injected through the injection hole 621 flows along the inner surface 620 of the lower mold 62 and another portion flows toward the sheath 33 of the cable 3. Therefore, the molten resin 400 injected through the injection hole 611 and flowing toward the sheath 33 of the cable 3 is mixed with the molten resin 400 injected through the injection hole 621 and flowing toward the sheath 33 of the cable 3.

As shown in FIG. 6E, once a space in the upper mold 61 on the inner surface 610 side and a space in the lower mold 62 on the inner surface 620 side are filled with the molten resin 400, the molten resin 400 then flows into the remaining inner space of the mold 6 and the mold 6 is thereby filled with the molten resin 400, as shown in FIG. 6F.

Functions and Effects of the Second Embodiment

In the second embodiment, the same functions and effects as (1) to (5) described in the first embodiment are obtained. In addition, the following functions and effects are also obtained.

In case of using a mold with one injection hole to mold a small resin molded body 4 having a diameter of, e.g., not more than 15 mm, the surface temperature of the melting section of the sheath 33 is not sufficiently increased on the radially opposite side to the injection hole since the amount of the injected molten resin 400 is small. Therefore, the molten resin 400 and the sheath 33 are less likely to be adhered.

On the other hand, in the second embodiment, since the two injection holes 611 and 621 are formed at a position radially sandwiching the cable 3 to be arranged in the mold, the molten resin 400 injected through the injection hole 621 flows and reaches the melting section of the sheath 33 on the radially opposite side to the injection hole 611. This makes the very hot molten resin 400 flow at any circumferential positions of the melting section of the sheath 33. Therefore, even in the case of molding a small resin molded body 4 having a diameter of, e.g., not more than 15 mm, the sheath 3 is melted over the entire circumference for a shorter time and it is thus possible to reliably adhere the sheath 33 to the resin molded body 4.

Modification of the Second Embodiment

The second embodiment of the invention can be modified as follows.

Figure 7:
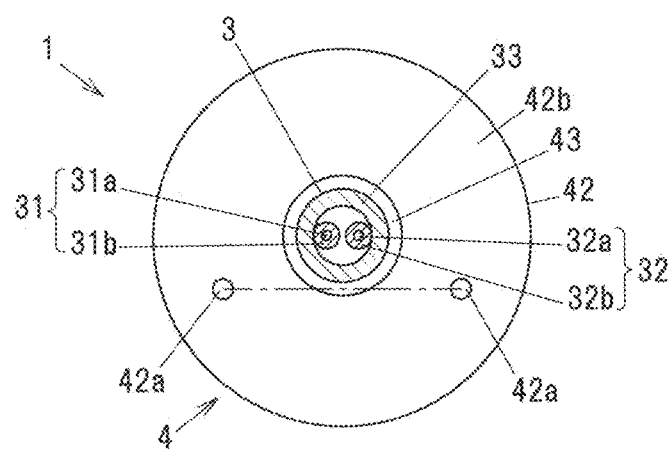
FIG. 7 is a diagram illustrating a physical quantity measurement sensor in a modification of the second embodiment of the invention as viewed from a cable lead-out side.
Figure 8A:
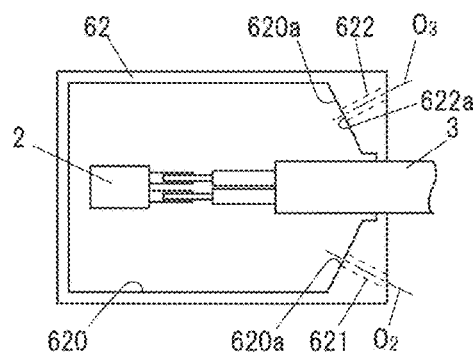

FIG. 7 is a diagram illustrating the physical quantity measurement sensor 1 in a modification of the second embodiment of the invention as viewed from the lead-out direction of the cable 3. FIGS. 8A to 8F are schematic views showing the manufacturing process of the physical quantity measurement sensor 1 in the modification of the second embodiment as viewed from the upper mold 61 side, wherein FIG. 8A shows a state in which the measurement portion 2 connected to the cable 3 is arranged in the mold and FIGS. 8B to 8F show movement of the molten resin 400 flowing in the mold 6.

Figure 8D:
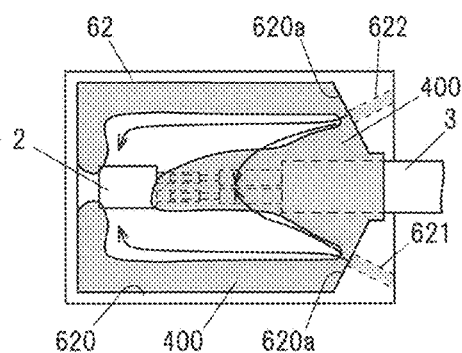
Figure 8B:
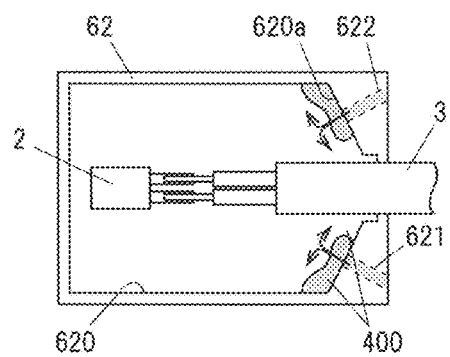
Figure 8E:
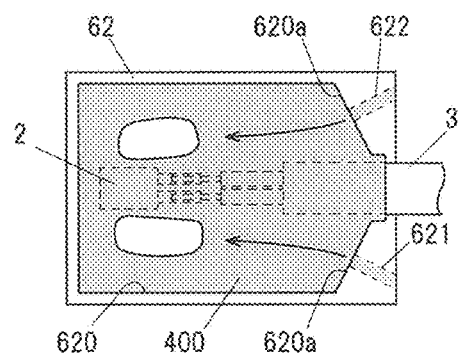
Figure 8C:
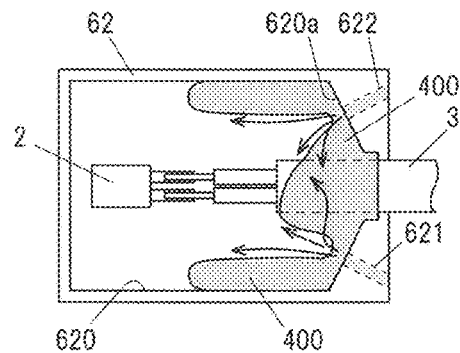
Figure 8F:
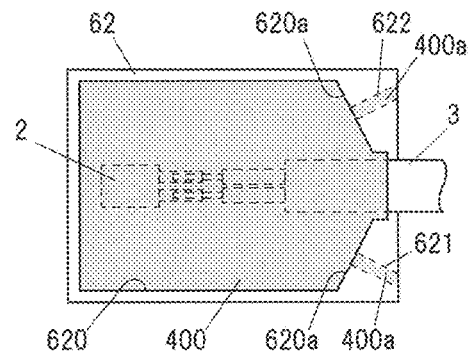

Constituent elements having the same functions as those described in the first and second embodiments are denoted by the same reference numerals in FIGS. 7 to 8F and the overlapping explanation thereof will be omitted.

In the modification of the second embodiment, two injection hole-gate marks 42a are formed at positions radially sandwiching at least a portion of the cable 3 but, unlike the second embodiment, the positions of the two injection hole-gate marks 42a are not symmetric with respect to the axis of the cable 3.

Here, "the positions radially sandwiching at least a portion of the cable 3" means a positional relation such that a line joining the centers of the two injection hole-gate marks 42a (indicated by a dash-dot line in FIG. 7) crosses at least a portion of the cable 3, as shown in FIG. 7. Note that, the positional relation of the two injection hole-gate marks 42a is not limited to that specifically illustrated in FIG. 7 as long as two injection hole-gate marks 42a are provided at positions radially sandwiching at least a portion of the cable 3 and the positions of the injection hole-gate marks 42a on the inclined surface 42b of the inclined portion 42 are not specifically limited.

In this modification, two injection holes 621 and 622 are formed in the lower mold 62. In more detail, the injection holes 621 and 622 are formed at positions radially sandwiching at least a portion of the cable 3 to be arranged in the mold. Alternatively, the two injection holes 621 and 622 may be both formed in the upper mold 61 or may be formed one each in the upper mold 61 and the lower mold 62.

As shown in FIG. 8A, the injection hole 621 has the opening 621a on the inclined surface 620a at a position distant from the cable 3 to be arranged in the mold and has the central axis $O_2$ inclined with respect to the axial direction of the cable 3 at the opening 621a. Likewise, the injection hole 622 has an opening 622a on the inclined surface 620a at a position distant from the cable 3 to be arranged in the mold 6 and has a central axis $O_3$ inclined with respect to the axial direction of the cable 3 at the opening 622a.

Thus, also in this modification, the central axis $O_2$ and the central axis $O_3$ are inclined with respect to the axial direction of the cable 3 such that an extension line from the central axis $O_2$ of the injection hole 621 extended on the opening 621a side intersects with an extension line from the central axis $O_3$ of the injection hole 622 extended on the opening 622a side.

In the molding step, the molten resin 400 injected through the injection holes 621 and 622 initially spreads circumferentially outward of the openings 621a and 622a in the same manner as the second embodiment, as shown in FIG. 8B.

Then, as shown in FIGS. 8C and 8D, a portion of the molten resin 400 injected through the injection hole 621 flows along the inner surface 620 and another portion flows toward the sheath 33 of the cable 3. Likewise, a portion of the molten resin 400 injected through the injection hole 622 flows along the inner surface 620 and another portion flows toward the sheath 33 of the cable 3. Therefore, the molten resin 400 injected through the injection hole 621 and flowing toward the sheath 33 of the cable 3 is mixed with the molten resin 400 injected through the injection hole 622 and flowing toward the sheath 33 of the cable 3.

As shown in FIG. 8E, once a space in the lower mold 62 on the inner surface 620 side is filled with the molten resin 400, the molten resin 400 then flows into the remaining inner space of the mold and the mold is thereby filled with the molten resin 400, as shown in FIG. 8F.

Third Embodiment

Next, the third embodiment of the invention will be described in reference to FIGS. 9A and 9B.

Figure 9A:
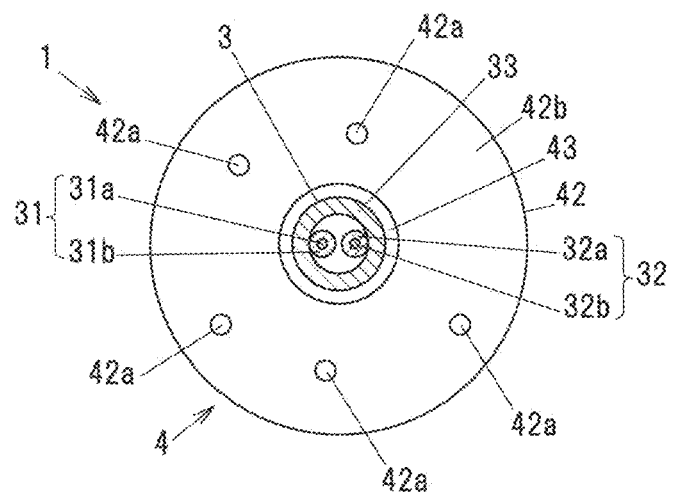
FIG. 9A is a diagram illustrating a physical quantity measurement sensor in a third embodiment of the invention one as viewed from the cable lead-out side.
Figure 9B:
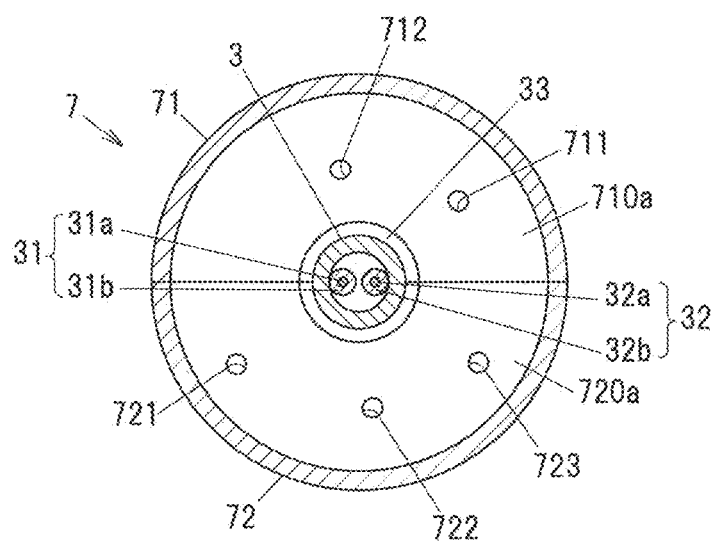
FIG. 9B is a diagram illustrating a mold with the cable arranged therein in the third embodiment as viewed from the measurement portion side.

FIG. 9A is a diagram illustrating the physical quantity measurement sensor 1 in the third embodiment of the invention as viewed from the lead-out side of the cable 3 and FIG. 9B is a diagram illustrating a mold 7 with the cable 3 arranged therein in the third embodiment as viewed from the measurement portion 2 side.

Constituent elements having the same functions as those described in the first and second embodiments are denoted by the same reference numerals in FIGS. 9A and 9B and the overlapping explanation thereof will be omitted.

The physical quantity measurement sensor 1 of the third embodiment has plural (five in the third embodiment) injection hole-gate marks 42a which are formed on the inclined surface 42b of the inclined portion 42 of the resin molded body 4 so as to surround the cable 3. Here, "surround the cable 3" means that the cable 3 is enclosed in a region formed by connecting the centers of the injection hole-gate marks 42a.

Note that, the plural injection hole-gate marks 42a on the inclined surface 42b do not necessarily need to be arranged at equal intervals along, e.g., a circumferential direction of the cable 3 as long as the cable 3 is surrounded.

Plural (five in the third embodiment) injection holes 711, 712 and 721 to 723 are formed in the mold 7 so as to surround the cable 3 which is arranged in the mold 7 in the arrangement step. In the third embodiment, among the five injection holes 711, 712 and 721 to 723, two injection holes 711 and 712 are formed in an upper mold 71 and the remaining three injection holes 721 to 723 are formed in a lower mold 72, as shown in FIG. 9B.

Note that, a positional relation between the five injection holes 711, 712 and 721 to 723 of the mold 7 is not specifically limited, neither, as long as the injection holes 711, 712 and 721 to 723 are formed in inclined surfaces 710a and 720a so as to surround the cable 3 to be arranged.

Functions and Effects of the Third Embodiment

In the third embodiment, the same functions and effects as (1) to (5) described in the first embodiment are also obtained. In addition, since the plural injection holes 711, 712 and 721 to 723 are provided to surround the cable 3, the very hot molten resin 400 flows evenly at any circumferential positions near the plural injection holes 711, 712 and 721 to 723 in the axial direction of the cable 3. Therefore, the sheath 33 is melted over the entire circumference for a further short time and it is possible to reliably adhere the sheath 33 to the resin molded body 4.

SUMMARY OF THE EMBODIMENTS

Technical ideas understood from the embodiments will be described below citing the reference numerals, etc., used for the embodiments. However, each reference numeral, etc., described below is not intended to limit the constituent elements in the claims to the members, etc., specifically described in the embodiments.

[1] A method of manufacturing a physical quantity measurement sensor (1) that comprises a measurement portion (2) for measuring a physical quantity, a cable (3) comprising a conductor(s) (center conductors 31a and 32a) electrically connected to the measurement portion (2) and a sheath (33) covering the center conductors (31a and 32a), and a resin molded body (4) covering at least an end portion of the cable (3) on the measurement portion (2) side, the method comprising: arranging the measurement portion (2) connected to the cable (3) in a mold (5); and molding the resin molded body (4) by injecting a molten resin (400) toward the sheath (33) through an injection hole (500) provided on the mold (5), wherein the injection hole (500) is formed at a position distant from the cable (3) and has a central axis (O) inclined with respect to the axial direction of the cable (3) at an opening (500a) facing the inside of the mold (5), and the sheath (33) arranged in the mold (5) is at least partially melted during the molding by heat of the molten resin (400) injected through the injection hole (500) and is adhered to the resin molded body (4).

[2] The method described in the [1], wherein the injection holes (611 and 621/621 and 622) are formed at positions radially sandwiching the cable (3) arranged in the mold (6).

[3] The method described in the [1] or [2], wherein the injection holes (711, 712 and 721 to 723) are formed so as to surround the cable (3) arranged in the mold (7).

[4] The method described in any of the [1] to [3], wherein, during the molding, the sheath (33) of the cable (3) arranged in the mold (5) is melted over the entire circumference by the heat of the molten resin (400) injected through the injection hole (500).

[5] The method described in any of the [1] to [4], wherein an inner surface (510, 520) of the mold (5) comprises an inclined surface (510a, 520a) that is directed to the cable (3) and is inclined with respect to the axial direction, and the injection hole (500) is formed in the mold (5) so as to have the opening (500a) on the inclined surface (510a, 520a).

[6] The method described in the [5], wherein an angle formed between the inclined surface (510a, 520a) and the axial direction of the cable (3) is set to 30° to 75°.

[7] The method described in the [5] or [6], wherein a distance along the inclined surface (520a) from the sheath (33) to the central axis (O) of the injection hole (500) at the opening (500a) is from 1 to 10 mm.

[8] The method described in any of the [1] to [7], wherein the injection hole (500A) is formed in the mold (5) such that a line extended from the injection hole (500A) intersects with the sheath (33).

[9] A physical quantity measurement sensor (1), comprising: a measurement portion (2) for measuring a physical quantity; a cable (3) comprising a conductor(s) (center conductors 31a and 32a) electrically connected to the measurement portion (2) and a sheath (33) covering the center conductors (31a and 32a); and a resin molded body (4) covering at least an end portion of the cable (3) on the measurement portion (2) side, wherein the sheath (33) of the cable (3) covered with the resin molded body (4) is at least partially melted and is adhered to the resin molded body (4).

[10] The physical quantity measurement sensor (1) described in the [9], wherein the sheath (33) of the cable (3) covered with the resin molded body (4) is melted over the entire circumference and is adhered to the resin molded body (4).

[11] The physical quantity measurement sensor (1) described in the [9] or [10], wherein injection hole-gate marks (42a) remaining after injecting a molten resin (400) are formed on the resin molded body (4) at positions sandwiching the cable (3) in a radial direction thereof.

[12] The physical quantity measurement sensor (1) described in any of the [9] to [11], wherein the injection hole-gate marks (42a) surround the cable (3).

[13] A sealing structure of a physical quantity measurement sensor (1) that comprises a measurement portion (2) for measuring a physical quantity, a cable (3) electrically connected to the measurement portion (2) and a resin molded body (4) covering at least an end portion of the cable (3) on the measurement portion (2) side, wherein a sheath (33) of the cable (3) covered with the resin molded body (4) is at least partially melted and is adhered to the resin molded body (4), thereby sealing between the resin molded body (4) and the cable (3).

[14] The structure described in the [13], wherein the sheath (33) covered with the resin molded body (4) is melted over the entire circumference and is adhered to the resin molded body (4), thereby sealing between the resin molded body (4) and the cable (3).

[15] A method of manufacturing a cable with resin molded body that comprises a cable (3) and a resin molded body (4) covering at least an end portion of the cable (3), the cable (3) comprising a conductor(s) (center conductors 31a and 32a) and a sheath (33) covering the center conductors 31a and 32a, the method comprising: arranging the end portion of the cable (3) in a mold (5); and molding the resin molded body (4) by injecting a molten resin (400) toward the sheath (33) through an injection hole (500) formed in the mold (5), wherein the injection hole (500) is formed at a position distant from the cable (3) and has a central axis (O) inclined with respect to the axial direction of the cable (3) at an opening (500a) facing the inside of the mold (5), and the sheath (33) arranged in the mold (5) is at least partially melted during the molding by heat of the molten resin (400) injected through the injection hole (500) and is adhered to the resin molded body (4).

[16] The method described in the [15], the injection holes (611 and 621/621 and 622) are formed at positions radially sandwiching the cable (3) arranged in the mold (6).

[17] The method described in the [15] or [16], wherein the injection holes (711, 712 and 721 to 723) are formed so as to surround the cable (3) arranged in the mold (7).

Although the embodiments of the invention have been described, the invention according to claims is not to be limited to the embodiments. Further, please note that all combinations of the features described in the embodiments are not necessary to solve the problem of the invention.

The invention can be appropriately modified and implemented without departing from the gist thereof. For example, although the cable 3 in the embodiments is formed by providing the sheath 33 to cover the two electric wires 31 and 32 respectively having the center conductors 31a and 32a and insulations 31b and 32b, it is not limited thereto. The cable 3 may be, e.g., a cable composed of a conductor and a sheath without insulation, etc., or may be a cable formed by covering three or more electric wires with a sheath. In other words, it is possible to use a cable in accordance with the intended use of the physical quantity measurement sensor 1.

In addition, although the physical quantity measurement sensor 1 has been described as one aspect of the cable with resin molded body in the embodiments, it is not limited thereto. The cable with resin molded body is also applicable to, e.g., a connector, etc.

In addition, the position(s) of the injection hole(s) 500, 500A, 611, 621, 622, 711, 712, 721 to 723 is not specifically limited as long as the injection hole(s) is formed in the inclined surface(s) 510a, 520a, 610a, 620a, 710a, 720a of the mold 5, 6, 7.

In addition, although the body portion 41 of the resin molded body 4 has a columnar shape in the embodiments, it is not limited thereto. It may be, e.g., a square column shape.

In addition, although the openings of the injection holes 500, 500A, 611, 621, 622, 711, 712 and 721 to 723 have a circular shape in the embodiments, it is not limited thereto. The openings may have a shape corresponding to a shape of a nozzle, etc., from which the molten resin 400 is injected.

What is claimed is:

1. A method of manufacturing a physical quantity measurement sensor, wherein the physical quantity measurement sensor comprises a measurement portion for measuring a physical quantity, a cable comprising a conductor electrically connected to the measurement portion and a sheath covering the conductor, and a resin molded body covering at least an end portion of the cable on a side of the measurement portion, the method comprising:
   arranging the measurement portion connected to the cable in a mold; and
   molding the resin molded body by injecting a molten resin toward the sheath through an injection hole formed in the mold,
   wherein the injection hole is formed at a position distant from the cable and comprises a central axis inclined at an angle that is less than 90° and more than 0° with respect to the axial direction of the cable at an opening facing an inside of the mold,
   wherein the molding is conducted such that the sheath arranged in the mold is at least partially melted by heat of the molten resin injected through the injection hole and is adhered to the resin molded body,
   wherein an inner surface of the mold comprises an inclined surface that is directed to the cable and is inclined with respect to the axial direction at an angle that is less than 90°, and the injection hole is formed in the mold so as to have the opening on the inclined surface, and the inclined surface defines a continuously tapered end portion of the mold, and
   wherein a distance along the inclined surface from the sheath to the central axis of the injection hole at the opening is at least about 1 mm, and the central axis of the injection hole intersects the cable between a point on the conductor and a point on the sheath.

2. The method according to claim 1, wherein the injection hole is formed at a position radially sandwiching the cable arranged in the mold.

3. The method according to claim 1, wherein the injection hole is formed so as to surround the cable arranged in the mold.

4. The method according to claim 1, wherein the molding of the resin molded body is conducted such that the sheath of the cable arranged in the mold is melted at an entire circumference by the heat of the molten resin injected through the injection hole.

5. The method according to claim 1, wherein an angle formed between the inclined surface and the axial direction of the cable is set to 30° to 75°.

6. The method according to claim 1, wherein a distance along the inclined surface from the sheath to the central axis of the injection hole at the opening is from 1 to 10 mm.

7. The method according to claim 1, wherein the injection hole is formed in the mold such that a line extended from the injection hole intersects with the sheath.

8. A method of manufacturing a cable with a resin molded body, wherein the cable comprises a conductor and a sheath covering the conductor and the resin molded body covering at least an end portion of the cable, the method comprising:
   arranging the end portion of the cable in a mold; and
   molding the resin molded body by injecting a molten resin toward the sheath through an injection hole formed in the mold,
   wherein the injection hole is formed at a position distant from the cable and comprises a central axis inclined at an angle that is less than 90° and greater than 0° with respect to an axial direction of the cable at an opening facing an inside of the mold, and
   wherein the molding is conducted such that the sheath arranged in the mold is at least partially melted by heat of the molten resin injected through the injection hole and is adhered to the resin molded body, and wherein an inner surface of the mold comprises an inclined surface that is directed to the cable and is inclined with respect to the axial direction at an angle that is less than 90°, and the injection hole is formed in the mold so as to have the opening on the inclined surface, and the inclined surface defines a continuously tapered end portion of the mold, and wherein a distance along the inclined surface from the sheath to the central axis of the injection hole at the opening is at least about 1 mm, and the central axis of the injection hole intersects the cable between a point on the conductor and a point on the sheath.

9. The method according to claim 8, wherein the injection hole is formed at a position radially sandwiching the cable arranged in the mold.

10. The method according to claim 8, wherein the injection hole is formed so as to surround the cable arranged in the mold.

* * * * *